United States Patent
Nguyen et al.

(10) Patent No.: US 11,264,526 B1
(45) Date of Patent: Mar. 1, 2022

(54) INFRARED PHOTODETECTOR WITH OPTICAL AMPLIFICATION AND LOW DARK CURRENT

(71) Applicant: HRL Laboratories, LLC, Malibu, CA (US)

(72) Inventors: Minh B. Nguyen, Thousand Oaks, CA (US); Diego Carrasco, Los Angeles, CA (US); Rajesh D. Rajavel, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/752,072

(22) Filed: Jan. 24, 2020

Related U.S. Application Data

(60) Provisional application No. 62/824,883, filed on Mar. 27, 2019.

(51) Int. Cl.
| | | |
|---|---|---|
| H01L 31/11 | (2006.01) | |
| H01L 31/0224 | (2006.01) | |
| H01L 31/0304 | (2006.01) | |
| H01L 31/18 | (2006.01) | |
| H01L 31/0368 | (2006.01) | |
| H01L 31/0352 | (2006.01) | |

(52) U.S. Cl.
CPC .. *H01L 31/1105* (2013.01); *H01L 31/022408* (2013.01); *H01L 31/0304* (2013.01); *H01L 31/0368* (2013.01); *H01L 31/035236* (2013.01); *H01L 31/184* (2013.01)

(58) Field of Classification Search
CPC ......... H01L 31/1105; H01L 31/035236; H01L 31/0304; H01L 31/022408; H01L 31/0368; H01L 31/184
See application file for complete search history.

(56) References Cited

U.S. PATENT DOCUMENTS

| | | | | |
|---|---|---|---|---|
| 5,159,424 | A | * 10/1992 | Morishita | ......... H01L 27/14681 257/197 |
| 2008/0203425 | A1* | 8/2008 | Sulima | .............. H01L 31/03046 257/185 |
| 2016/0315211 | A1* | 10/2016 | Chandrashekhar | .......................... H01L 31/1804 |

OTHER PUBLICATIONS

"InP / InGaAs Heterojunction Phototransistors", Joe C. Campbell, Andrew G. Dentai, Charles A. Burrus, Jr., Fellow, IEEE, and John F. Ferguson, IEEE Journal of Quantum Electronics, vol. 17, pp. 264-269, Feb. 1981.

"Mid-wavelength infrared heterojunction phototransistors based on type-II InAs/AlSb/GaSb superlattices" A. Haddadi, S. Adhikary, A. Dehzangi, and M. Razeghi, Applied Physics Letters 109, 021107 (2016).

"Impact of scaling base thickness on the performance of heterojunction phototransistors" Arash Dehzangi et al, Nanotechnology 28 (2017) 10LT01.

* cited by examiner

*Primary Examiner* — Matthew L Reames
(74) *Attorney, Agent, or Firm* — Ladas & Parry

(57) ABSTRACT

A phototransistor includes an emitter, a collector, and a base between the emitter and the collector. The base has a thickness greater than 500 nanometers and the base absorbs photons passing through the collector to the base.

25 Claims, 4 Drawing Sheets

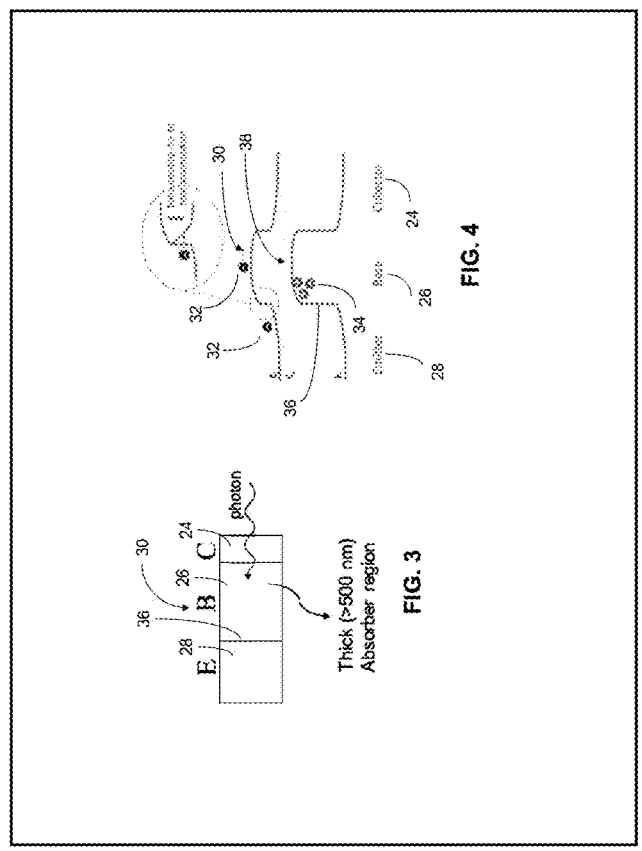
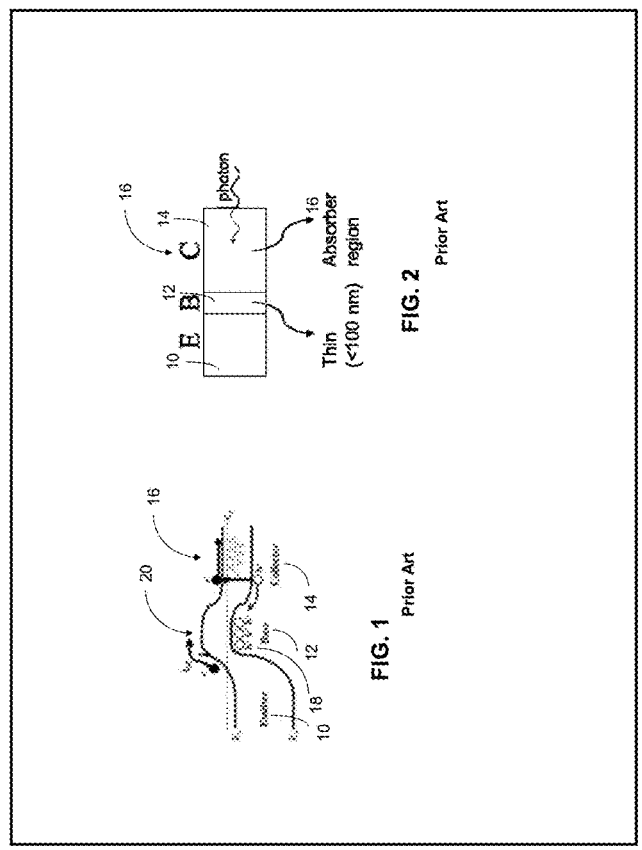

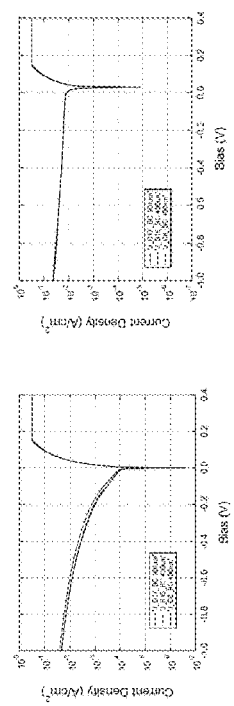
FIG. 6A
FIG. 6B
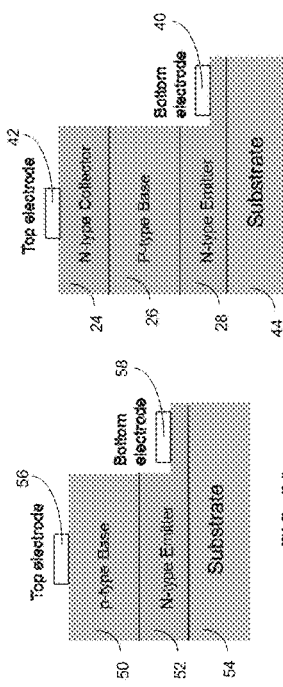
FIG. 5A
FIG. 5B

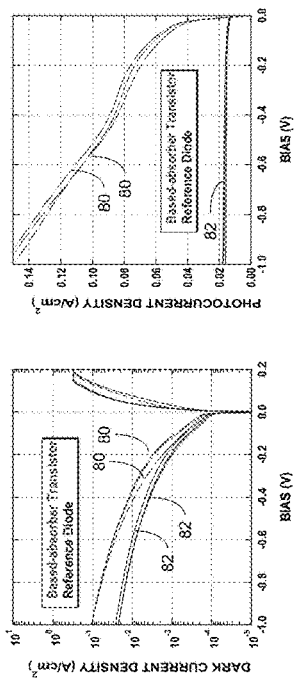
FIG. 8A
FIG. 8B
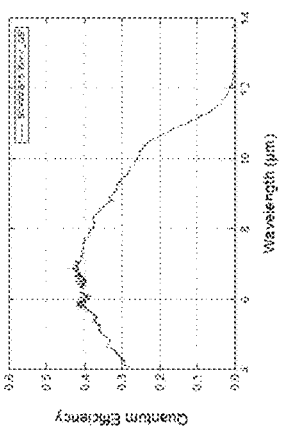
FIG. 7

INFRARED PHOTODETECTOR WITH OPTICAL AMPLIFICATION AND LOW DARK CURRENT

CROSS REFERENCE TO RELATED APPLICATIONS

This application is related to and claims the benefit of U.S. Provisional Patent Application No. 62/824,883, filed on Mar. 27, 2019, which is incorporated herein by reference as though set forth in full.

STATEMENT REGARDING FEDERAL FUNDING

This invention was made with U.S. Government support under contract NR0000-16-C-0035. The U.S. Government has certain rights in this invention.

TECHNICAL FIELD

This disclosure relates to infrared (IR) detectors.

BACKGROUND

IR detectors with gain, such as prior art avalanche photodiodes or phototransistors, have been previously described by others. Such devices, however, normally operate in a high bias (>1V) regime for stability and have high gain (>500). An unavoidable consequence is a high dark current, due to the high pre-gain current at large bias, which is then amplified by the high gain factor. This makes gained IR detectors not readily compatible with conventional read out integrated circuits (ROICs) for focal plane arrays. Thus special ROICs are needed; however, these ROICs in the prior art are only suitable for the short wave infrared (SWIR) and medium wave infrared (MWIR) regimes. No gained focal plane array (FPA) has been reported in the prior art for long wave infrared (LWIR) or very long wave infrared (VLWIR) regimes. Even in the SWIR and MWIR regimes, the amplified dark current is quite high, which requires the FPA to operate in an active mode with very short integration times, and to be synced with an active pulse laser.

In prior phototransistor designs, the absorber is located in the collector region, while the base of the phototransistor is of a material with a smaller bandgap than the absorber. In the prior art, the base is also designed to be very thin (tens of nanometers), which results in a large electrical potential in the base due to charge accumulation. Thus, the gain in these prior art devices is intrinsically high (>500).

What is needed is an infrared photodetector that enables an amplified passive imaging mode, and also an active imaging mode in the LWIR and VLWIR regimes. Also needed is an infrared photodetector with optical amplification and low dark current. The embodiments of the present disclosure answer these and other needs.

SUMMARY

In a first embodiment disclosed herein, a phototransistor comprises an emitter, a collector, and a base between the emitter and the collector, wherein the base has a thickness greater than 500 nanometers, and wherein the base absorbs photons passing through the collector to the base.

In another embodiment disclosed herein, a method of providing a phototransistor comprises providing an emitter, providing a collector, and providing a base between the emitter and the collector, wherein the base has a thickness greater than 500 nanometers, and wherein the base absorbs photons passing through the collector to the base.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 1 shows the band bending for a prior art phototransistor in accordance with the prior art.

FIG. 2 shows a prior art phototransistor having a base less than 100 nanometers (100 nm) in width, and an absorber in the collector in accordance with the prior art.

FIG. 3 shows a phototransistor in accordance with the present disclosure.

FIG. 4 shows a band diagram illustrating the working principle of a base-absorber phototransistor in accordance with the present disclosure.

FIG. 5A shows a schematic diagram of a reference diode device and FIG. 5B shows a base-absorber phototransistor in accordance with the present disclosure.

FIG. 6A shows the current-voltage (I-V) characteristics of the reference diode of FIG. 5A at 71K without illumination and FIG. 6B shows the I-V characteristics of the reference diode of FIG. 5A under 1000 degrees centigrade blackbody illumination in accordance with the present disclosure.

FIG. 7 shows a quantum efficiency (QE) spectrum of the reference diode device, exhibiting a QE>35% at $\lambda=8$ μm in accordance with the present disclosure.

FIGS. 8A and 8B show a comparison of dark current (FIG. 8A) and photo current (FIG. 8B) between the base-absorber phototransistor of FIG. 5B and the reference diode of FIG. 5A at 71 degrees Kelvin (71K) in accordance with the present disclosure.

DETAILED DESCRIPTION

Figure 10:
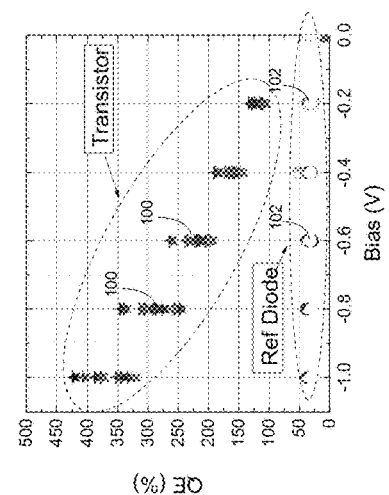
FIG. 10 shows the quantum efficiency as a function of applied bias for the reference diode device (circles) versus the base-absorber phototransistor (stars) in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes an infrared (IR) detector that enables high quantum efficiency while maintaining low dark current to be compatible with conventional read out integrated circuitry (ROIC). The infrared detector works in a two-terminal phototransistor mode where the photo signal is amplified with a gain greater than 1, which may be defined as a ratio between amplified current over a baseline pre-amplified current. The infrared detector device of the present disclosure requires only a low applied bias voltage and the gain can be controlled to be in a moderate range between 1 and 50 to maintain a low dark current.

The infrared detector of the present disclosure allows the use of gain-mode IR detectors in focal plane arrays using conventional ROICs. The low dark current is a key requirement for the focal plane array's noise to be dominated by the ROIC noise rather than noise caused by dark current. Prior-art phototransistor designs have a high dark current, which is undesirable.

Because of the low dark noise, the IR detector of the present disclosure can benefit from the gain of the detector to amplify the signal while the dominant noise mechanism due to the ROIC is not amplified. As a consequence, the signal-to-noise ratio for the focal plane array, which includes the IR detector, is improved by a factor equal to the gain. The improved signal-to-noise ratio enables detection of dimmer objects and better imaging contrast.

InP/InGaAs short wave infrared (SWIR) phototransistors were demonstrated over 30 years ago, as described in IEEE Journal of Quantum Electronics, vol. 17, pp. 264-269, February 1981), which is incorporated herein by reference. Recently, III-V superlattice-based mid-wave infrared (MWIR) phototransistors have been reported by Northwestern University (NWU) researchers, as described in Applied Physics Letters 109, 021107 (2016), which is incorporated herein by reference.

In the previously reported prior art designs, the detector typically consists of an emitter 10, a thin base 12, and a collector 14, as shown in FIG. 2. Nanotechnology 28 (2017) 10LT01, which is incorporated herein by reference, describe such a device. The infrared absorbing layer 16 in these prior art devices is in the thick collector 14, which is reverse biased and fully depleted to achieve a transistor action. The photon generated carriers in the collector 14 drift or diffuse to the base 12, resulting in large accumulation of carriers 18 in the thin base 12, thus creating strong band bending 20 in the thin base 12, as shown in FIG. 1, which promotes a high current running from the emitter 10 to the collector 14. The main characteristics of these prior art phototransistor designs are: a thin base 12 less than 100 nm wide, a collector 14 that operates as an absorber, a high applied voltage (>1V), and a high gain (>500).

FIG. 3 shows a phototransistor in accordance with the present disclosure, which has a collector 24, thick base 26 and an emitter 28. The phototransistor of the present disclosure may also be called a base-absorber phototransistor. The light absorbing region 30 is in the base 26 of the phototransistor, as shown in FIG. 3, rather than the collector 14 in the prior art phototransistors, as shown in FIG. 2.

The narrow gap absorber 30 is incorporated in the thick base layer 26, and operated under a relatively low reverse bias of less than 1 volt (<1V) to minimize any dark current penalty. Gain is achieved though the injection of electrons 32 from the emitter 28 facilitated by the accumulation of photon generated holes 34 in the base 26, as shown in FIG. 4. The base-absorber photo-transistor has a thick base/absorber 26, 30 and a wide bandgap collector 24, which are designed to suppress dark current. Prior art phototransistor designs, as discussed above, have a thin base 12 and a narrow bandgap collector/absorber 14, 16 layer to provide high gain (>500), which results in a high dark current penalty.

The working principle of the base-absorber phototransistor shown in FIG. 3, is illustrated in the band diagram of FIG. 4, for the case of an npn phototransistor, where the emitter 28 and collector 24 are n-type, and the base 26 is p-type. The base-absorber phototransistor may also be a pnp phototransistor. The absorber 30 is incorporated in the thick base layer 26, and the two-terminal detector is operated under a relatively low (<1 V) bias between the emitter electrode 40 and the collector electrode 42, as shown in FIG. 5B and further described below.

When a photon (light) is absorbed in the base absorber phototransistor, a photon generated electron and hole pair is created. The electron can freely move to the collector 24 while the hole stays in the base 26 as it has a barrier at the base-emitter interface 36. The accumulation of holes 34 near the base-emitter interface 36 changes the band profile 38, as shown in FIG. 4, making the potential barrier for electrons in the conduction band less wide and allowing for a tunneling current of electrons from the emitter 28 through the base 26 to the collector 24. This current is induced by the photon generated holes, hence, is a photocurrent.

Compared with prior-art designs, the accumulated photon generated carrier density within the thick base 26 of the base-absorber IR detector is considerably less than that for the prior art phototransistors with a thin base 12. Thus, the base-absorber phototransistor can achieve modest gain of less than 50 with a small applied bias of less than 1V, as opposed to the greater than 500 gain with a large bias of greater than 1V for prior art phototransistors.

Another advantage of the IR detector of the present disclosure is the fact that photon generated holes do not have to diffuse from the collector 24 to the base 26, but instead reside within the base 26, which results in a higher speed for the base-absorber phototransistor. This also facilitates the use of materials with a short diffusion length, such as polycrystalline or inorganic materials. In the prior art designs, these materials are undesirable because holes generated in the collector 14 might recombine before arriving in the base 12.

FIG. 5A shows a schematic diagram of a reference diode device and FIG. 5B shows a base-absorber phototransistor in accordance with the present disclosure.

An example base-absorber phototransistor has been fabricated using InAs/GaSb superlattice materials with an energy gap of ~100 meV for the base region 26, and InAs/GaSb/AlSb/GaSb superlattice materials with an energy gap of ~200 meV for the emitter 28 and the collector 24. In the fabricated example, as schematically shown in FIG. 5B, the emitter contact 40 and the collector contact 42 are formed to be about 2 µm thick, the base 26 formed to be about 3 µm thick, and the collector 24 formed to be about 0.75 µm thick. The emitter and collector superlattices are designed such that a small discontinuity forms in the conduction band of the emitter 28 and the base 26, and most of the bandgap difference is in the valence band discontinuity for the barrier for holes. The base-absorber phototransistor is contacted by contacts 42 and 40 between the collector 24 and the emitter 28, respectively, as shown in FIG. 5B. The emitter 28 is formed on a substrate 44, which may for example be a GaSb substrate.

A reference diode device, as shown in FIG. 5A, was also fabricated by removing the top collector to make a photodiode between the base 50 and the emitter 52 formed on substrate 54. The reference diode is contacted by contacts 56 and 58 between the base 50 and the emitter 52, respectively, as shown in FIG. 5A.

Characterization results for the reference diode of FIG. 5A are shown in FIGS. 6A, 6B and 7. FIG. 6A shows the current-voltage (I-V) characteristics of the reference diode of FIG. 5A at 71K without illumination and FIG. 6B shows the I-V characteristics of the reference diode of FIG. 5A under a 1000 degrees centigrade blackbody illumination. FIG. 7 shows a quantum efficiency (QE) spectrum of the reference diode device, exhibiting a QE>35% at λ=8 µm in accordance with the present disclosure.

At 71K, the dark current density is in the $10^{-4}$ A/cm$^2$ range, as shown in FIG. 6A, while the photo current under 1000° C. blackbody illumination is in the $10^{-2}$ A/cm$^2$ range, as shown in FIG. 6B. The quantum efficiency was measured to be 35% at λ=8 µm and independent of the applied bias. No photon multiplication gain was observed. The legends in FIGS. 6A, 6B and 7 identify different devices which were measured.

In the base-absorber transistor device of FIG. 5B, a gain mechanism was observed that substantially amplifies the photocurrent for a modest increase in the dark current. FIG. 8A shows the comparison of dark currents between the base-absorber transistor mode 80 and the reference diode 82 of FIG. 5B at 71K. FIG. 8B shows the comparison of photo currents between the base-absorber transistor 80 and the reference diode 82 of FIG. 5A at 71K. A clear distinction is the increase of phototransistor's photo current while that of the reference diode device remains unchanged. This indicates that the quantum efficiency of the phototransistor has a gain factor that is dependent on the applied bias.

Figure 9:
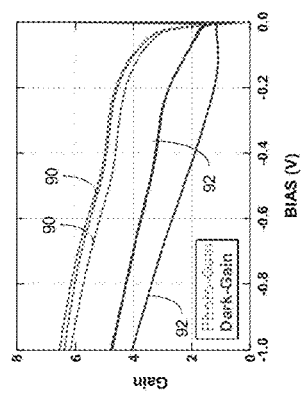
FIG. 9 shows the gain, defined by the ratio of currents in the base-absorber phototransistor of FIG. 5B and the reference diode of FIG. 5A, as a function of applied bias in accordance with the present disclosure.

The photo-gain 90 and the dark-gain 92, as defined by the ratio of the base-absorber phototransistor's current over reference diode device's current, are shown in FIG. 9. It can be seen that the photo current can be amplified depending on the bias by a factor of 2 to 6, while the dark current is increased by a smaller factor of between 2 and 4.

FIG. 10 shows the quantum efficiency 102 as a function of applied bias for the reference diode device of FIG. 5A, shown as circles 102, versus the quantum efficiency 100 as a function of applied bias for the Base-absorber phototransistor of FIG. 5B, shown as stars 100.

To make sure that the photo current amplification is being achieved by the generation of carriers in the base, the quantum efficiency (QE) of the devices were measured using a narrow band filter at 8.2 µm. The bandgap of the emitter and collector is about 200 meV, which is wider than a photon with a wavelength of 8.2 µm. Therefore, photons are not absorbed in the emitter or the collector, but only in the base, which has a smaller bandgap. As shown in FIG. 10, the QE of the reference diodes of FIG. 5A stays flat at ~35%, while the base-absorber phototransistors have a QE above 100% due to multiplication gain at bias larger than –200 mV. At –1V, the QE is 350%-400% without any sign of saturation. The gain, defined by a ratio of QE at λ=8.2 µm exceeds 10 with a bias of –1V.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A phototransistor comprising:
a first electrode and a second electrode;
an emitter with a first bandgap, wherein the first electrode is coupled to the emitter;
a collector with a second bandgap, wherein the second electrode is coupled to the collector; and
a base between the emitter and the collector, wherein the base has a smaller bandgap than the first bandgap for the emitter and a smaller bandgap than the second bandgap for the collector;
wherein the base has a thickness greater than 500 nanometers;
wherein the phototransistor is a two terminal detector having only the first electrode coupled to the emitter and the second electrode coupled to the collector;
wherein the phototransistor is configured to operate with a less than 1 volt bias between the emitter electrode and the collector electrode; and
wherein the base absorbs photons passing through the collector to the base.

2. The phototransistor of claim 1 further comprising:
a substrate;
wherein the emitter is on a first region of the substrate; and
wherein the emitter electrode is on a second region of the substrate.

3. The phototransistor of claim 1:
wherein a bias voltage between the collector the emitter is equal to or less than 1 volt; and
wherein a gain of the phototransistor is less than 50.

4. The phototransistor of claim 1 wherein:
the collector is an n-type collector;
the base is a p-type base; and
the emitter is an n-type emitter; or
the collector is an p-type collector;
the base is a n-type base; and
the emitter is an p-type emitter.

5. The phototransistor of claim 1:
wherein the respective bandgaps of the collector, base and emitter are configured so that when a photon passes through the collector and is absorbed in the base, a photon generated electron and hole pair is created in the base, the electron of the photon generated electron and hole pair can freely move to the collector, and the hole of the photon generated electron and hole pair stays in the base due to a barrier at a base-emitter interface.

6. The phototransistor of claim 5:
wherein the respective bandgaps of the collector, base and emitter are configured so that an accumulation of holes near the base-emitter interface changes a band profile near the base-emitter interface such that a potential barrier for electrons at the base-emitter interface allows a tunneling current of electrons from the emitter through the base to the collector induced by photon generated holes accumulated in the base.

7. The phototransistor of claim 1:
wherein the phototransistor comprises polycrystalline material or inorganic material.

8. The phototransistor of claim 1:
wherein the base comprises an InAs/GaSb superlattice with an energy gap of about 100 meV;
wherein the emitter comprises an InAs/GaSb/AlSb/GaSb superlattice with an energy gap of about 200 meV; and
wherein the collector comprises an InAs/GaSb/AlSb/GaSb superlattice with an energy gap of about 200 meV.

9. The phototransistor of claim 8:
wherein the base is about 3 μm thick;
wherein the emitter is about 2 μm thick; and
wherein the collector is about 0.75 μm thick.

10. The phototransistor of claim 1:
wherein a quantum efficiency of the phototransistor is dependent on an applied bias voltage between the collector and the emitter;
wherein a photo current gain of the phototransistor ranges from 2 to 6 depending on the applied bias voltage; and
wherein a dark current of the phototransistor ranges from 2 to 4 depending on the applied bias voltage.

11. The phototransistor of claim 1:
wherein a quantum efficiency of the phototransistor is greater than 100 percent for an applied bias voltage between the collector and the emitter greater than −200 millivolts; and
wherein a quantum efficiency of the phototransistor is greater than 300 percent for an applied bias voltage between the collector and the emitter of −1 volt, and a gain of the phototransistor exceeds 10.

12. A method of providing a phototransistor comprising:
providing a first electrode and a second electrode;
providing an emitter with a first bandgap, wherein the first electrode is coupled to the emitter;
providing a collector with a second bandgap, wherein the second electrode is coupled to the collector; and
providing a base between the emitter and the collector, wherein the base has a smaller bandgap than the first bandgap for the emitter and a smaller bandgap than the second bandgap for the collector;
wherein the base has a thickness greater than 500 nanometers;
wherein the phototransistor is a two terminal detector having only the first electrode coupled to the emitter and the second electrode coupled to the collector;
wherein the phototransistor is configured to operate with a less than 1 volt bias between the emitter electrode and the collector electrode; and
wherein the base absorbs photons passing through the collector to the base.

13. The method of claim 12 further comprising:
providing a substrate;
wherein the emitter is on a first region of the substrate; and
wherein the emitter electrode is on a second region of the substrate.

14. The method of claim 12 further comprising:
providing a bias between the collector electrode and the emitter electrode equal to or less than 1 volt; and
wherein a gain of the phototransistor is less than 50.

15. The method of claim 12 wherein:
the collector is an n-type collector;
the base is a p-type base; and
the emitter is an n-type emitter; or
the collector is an p-type collector;
the base is a n-type base; and
the emitter is an p-type emitter.

16. The method of claim 12:
wherein the respective bandgaps of the collector, base and emitter are configured so that when a photon passes through the collector and is absorbed in the base, a photon generated electron and hole pair is created in the base, the electron of the photon generated electron and hole pair can freely move to the collector, and the hole of the photon generated electron and hole pair stays in the base due to a barrier at a base-emitter interface.

17. The method of claim 16:
wherein the respective bandgaps of the collector, base and emitter are configured so that an accumulation of holes near the base-emitter interface changes a band profile near the base-emitter interface such that a potential barrier for electrons at the base-emitter interface allows a tunneling current of electrons from the emitter through the base to the collector induced by photon generated holes accumulated in the base.

18. The method of claim 12:
wherein the base comprises an InAs/GaSb superlattice with an energy gap of about 100 meV;
wherein the emitter comprises an InAs/GaSb/AlSb/GaSb superlattice with an energy gap of about 200 meV; and
wherein the collector comprises an InAs/GaSb/AlSb/GaSb superlattice with an energy gap of about 200 meV.

19. The method of claim 18:
wherein the base is about 3 μm thick;
wherein the emitter is about 2 μm thick; and
wherein the collector is about 0.75 μm thick.

20. The method of claim 12:
wherein a quantum efficiency of the phototransistor is dependent on an applied bias between the collector and the emitter;
wherein a photo current gain of the phototransistor ranges from 2 to 6 depending on the applied bias; and
wherein a dark current of the phototransistor ranges from 2 to 4 depending on the applied bias.

21. The method of claim 12:
wherein a quantum efficiency of the phototransistor is greater than 100 percent for an applied bias between the collector and the emitter greater than −200 millivolts; and
wherein a quantum efficiency of the phototransistor is greater than 300 percent for an applied bias between the collector and the emitter of −1 volt, and a gain of the phototransistor exceeds 10.

22. The phototransistor of claim 1:
wherein the collector and the emitter each have a bandgap of about 200 meV; and
wherein the base has a bandgap of about 100 meV.

23. The phototransistor of claim 1:
wherein the base comprises an InAs/GaSb superlattice;
wherein the emitter comprises an InAs/GaSb/AlSb/GaSb superlattice; and wherein the collector comprises an InAs/GaSb/AlSb/GaSb superlattice.

24. The method of claim 12:
wherein the collector and the emitter each have a bandgap of about 200 meV; and
wherein the base has a bandgap of about 100 meV.

25. The method of claim 12:
wherein the base comprises an InAs/GaSb superlattice;
wherein the emitter comprises an InAs/GaSb/AlSb/GaSb superlattice; and
wherein the collector comprises an InAs/GaSb/AlSb/GaSb superlattice.

\* \* \* \* \*